United States Patent
Narushima et al.

(10) Patent No.: US 8,263,181 B2
(45) Date of Patent: Sep. 11, 2012

(54) TI-BASED FILM FORMING METHOD AND STORAGE MEDIUM

(75) Inventors: Kensaku Narushima, Nirasaki (JP); Satoshi Wakabayashi, Nirasaki (JP); Takamitsu Takayama, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 293 days.

(21) Appl. No.: 12/426,047

(22) Filed: Apr. 17, 2009

(65) Prior Publication Data

US 2009/0208650 A1 Aug. 20, 2009

Related U.S. Application Data

(63) Continuation of application No. PCT/JP2007/070266, filed on Oct. 17, 2007.

(30) Foreign Application Priority Data

Oct. 19, 2006 (JP) .................................. 2006-285546

(51) Int. Cl.
*C23C 16/06* (2006.01)

(52) U.S. Cl. ..................... 427/250; 427/248.1

(58) Field of Classification Search ............... 427/248.1, 427/250
See application file for complete search history.

(56) References Cited

U.S. PATENT DOCUMENTS 5,963,834 A * 10/1999 Hatano et al. ................. 438/680
2001/0021414 A1 * 9/2001 Morishima et al. ......... 427/248.1
2005/0136657 A1 * 6/2005 Yokoi et al. .................... 438/680
2005/0233093 A1 * 10/2005 Tada et al. ..................... 427/569
2005/0257747 A1 11/2005 Wakabayashi et al.
2006/0127601 A1 * 6/2006 Murakami et al. ............ 427/569

FOREIGN PATENT DOCUMENTS

| JP | 2001-144033 | 5/2001 |
| JP | 2002-167673 | 6/2002 |
| JP | 2004-193396 | 7/2004 |
| JP | 2004-225162 | 8/2004 |
| JP | 2004-285469 | 10/2004 |
| JP | 2006-5147 | 1/2006 |

* cited by examiner

*Primary Examiner* — Elizabeth Burkhart
(74) *Attorney, Agent, or Firm* — Oblon, Spivak, McClelland, Maier & Neustadt, L.L.P.

(57) ABSTRACT

A Ti-based film forming method includes a step (step 1) of cleaning inside a chamber by introducing a cleaning gas containing fluorine into the chamber in a state where a wafer W is not provided on a susceptor; a step (step 2) of heating the susceptor in a state where the wafer W is not provided on the susceptor, injecting a processing gas containing Ti from a shower head into the chamber, and forming a pre-coated film at least on the surface of the shower head; and a step (step 3) of mounting the wafer W on the susceptor 2 in a state where the susceptor is heated, supplying a processing gas into the chamber 1 and forming a Ti-based film on the wafer W. The pre-coated film forming step is performed at a temperature lower than that in the film forming step.

20 Claims, 6 Drawing Sheets

TI-BASED FILM FORMING METHOD AND STORAGE MEDIUM

This application is a Continuation Application of PCT International Application No. PCT/JP2007/070266 filed on Oct. 17, 2007, which designated the United States.

FIELD OF THE INVENTION

The present invention relates to a Ti-based film forming method for forming a film containing a Ti element (Ti-based film) on a surface of a substrate to be processed disposed on a mounting table in a chamber by injecting a processing gas containing Ti through a shower head into the chamber and a storage medium which stores therein a program for executing the Ti-based film forming method.

BACKGROUND OF THE INVENTION

In a manufacture of a semiconductor device, to meet recent demands for higher density and higher integration degree, a circuit arrangement tends to have a multilayer interconnection structure. Therefore, a technique that forms a buried portion for electrically connecting layers to each other through a contact hole for connecting a lower semiconductor substrate to an upper wiring layer, or through a via hole for connecting a lower wiring layer to an upper wiring layer becomes important.

In order to form a contact between a polycrystalline silicon layer or an underlying Si substrate and an alloy or metal used to fill the contact hole or the via hole, a Ti film is formed at an inner side of the contact hole or the via hole before filling up the contact hole or the via hole.

Conventionally, the Ti film is formed by physical vapor deposition (PVD). However, along with a demand for miniaturization and higher integration of the devices, chemical vapor deposition (CVD) having a better step coverage has been widely used recently.

As for a technique for forming a Ti film by using CVD, there is suggested a technique for forming a Ti film using plasma CVD (e.g., Japanese Patent Laid-open Application No. 2003-313666). Here, $TiCl_4$ gas, $H_2$ gas and Ar gas as a film forming gas are introduced into a chamber through a shower head, and a semiconductor wafer as a substrate to be processed is heated to a predetermined temperature while being mounted on a susceptor having therein a heater. A plasma of the above gases is produced by a high frequency power applied to parallel plate electrodes, and $TiCl_4$ gas and $H_2$ gas react with each other.

When a Ti film is formed by employing plasma CVD, an unwanted film is formed in the chamber, so that the interior of the chamber which has been previously used for the Ti film formation is cleaned by $ClF_3$ gas. In order to prepare the chamber for a next Ti film formation, a pre-coating process for forming a Ti film on an inner wall of the chamber, the susceptor and the shower head is performed by using $TiCl_4$ gas and $H_2$ gas at a temperature same as that in a Ti film forming process. Thereafter, a Ti film is formed on a semiconductor wafer in the manner described above.

Conventionally, as for a material forming a susceptor, an AlN as ceramic having a high thermal conductivity is widely used. When cleaning is performed by using $ClF_3$ gas, an AlF-based material $AlF_x$ (x being a natural number) is generated through the reaction between AlN and $ClF_3$. Further, the AlF-based material is sublimated and adhered to a surface of a shower head during the pre-coating process. The AlF-based material, however, has lower adhesivity. Therefore, even if a Ti film is pre-coated on the AlF-based material, the pre-coated film may be peeled off during a film forming process, which may cause generation of particles. Moreover, the pre-coated film may be reduced by a film forming gas during the film forming process, so that the AlF-based material in a space formed between the surface of the shower head and the pre-coated film can be eluted into the film forming gas. In that case, the wafer surface may be contaminated by the AlF-based material released into the film forming gas.

Further, during the pre-coating process, Ti contained in the film forming gas reacts with Ni contained in the chamber or the shower head, thereby forming NiTi. The NiTi may be incorporated into the pre-coated film and be eluted during the film forming process, which may lead to contamination of the wafer surface.

SUMMARY OF THE INVENTION

The object of the present invention is to provide a Ti-based film forming method capable of suppressing metal contamination or peeling-off of a pre-coated film of a shower head during formation of a Ti-based film on a substrate mounted on a mounting table by using a processing gas containing Ti, wherein the mounting table, at least a surface of which is made of a material containing Al, is provided in a chamber.

Further, the present invention provides a storage medium which stores therein a program for performing the above embodiment.

In accordance with a first aspect of the present invention, there is provided a Ti-based film forming method for forming a Ti-based film on a surface of an object to be processed by using an apparatus including a chamber accommodating the object to be processed, a gas injection member for injecting a processing gas containing Ti into the chamber, a mounting table for mounting thereon the object to be processed in the chamber and having at least a surface made of a material containing Al, and a heating unit for heating the mounting table.

The Ti-based film forming method includes: cleaning inside the chamber by introducing a cleaning gas containing fluorine into the chamber while the object to be processed is not provided on the mounting table; forming a pre-coated film at least on a surface of the gas injecting member by injecting processing gases from the gas injecting member into the chamber while heating the mounting table without having the object to be processed provided on the susceptor; and forming a Ti-based film on the object to be processed by mounting the object to be processed on the mounting table while the mounting table is heated and supplying the processing gases into the chamber.

Herein, in the pre-coated film forming process, a temperature of the mounting table is set to be lower than a temperature to form the Ti-based film.

In the first aspect, preferably, the mounting table may be made of AlN and the gas injecting member may have at least a surface made of a material containing Ni.

Further, when the pre-coated film is formed, a temperature of the susceptor may be set to be lower than or equal to 500° C., and when the pre-coated film is formed, a temperature of the gas injecting member may be set to be within a range from 300° C. to 480° C. Furthermore, a temperature of the mounting table is set to be within a range from 170° C. to 250° C. in the cleaning process.

Moreover, a Ti-based film may be formed by a source gas containing Ti and a reducing gas in the pre-coated film forming process and the Ti-based film forming process. When the pre-coated film is formed, a source gas containing Ti and a reducing gas may be alternately supplied. The pre-coating process may include a nitriding process of the pre-coated film. The Ti-based film may be a Ti film, and in such case, the processing gas may contain $TiCl_4$ gas and $H_2$ gas. Further, after the Ti-based film forming process is completed, a nitriding process is performed on the Ti film.

Further, a period of time spanning from when the cleaning is completed to when the temperature of the mounting table is increased to a temperature for the pre-coated film formation may be set to be shorter than or equal to 60 minutes. Preferably, the cleaning gas may be $ClF_3$ gas. The gas injecting member may preferably be a shower head which is disposed to face the mounting table and has a plurality of gas injection openings.

In accordance with a second aspect of the present invention, there is provided a storage medium which stores therein a program for controlling a film forming apparatus for forming a Ti-based film on a surface of an object to be processed, the film forming apparatus including a chamber accommodating the object to be processed, a gas injecting member for injecting a processing gas containing Ti into the chamber, a mounting table for mounting thereon the object to be processed in the chamber and having at least a surface made of a material containing Al, and a heating unit for heating the mounting table.

The program, when executed, controls the film forming apparatus to perform a Ti film forming method including: cleaning inside the chamber by introducing a cleaning gas containing fluorine into the chamber while the object to be processed is not provided on the mounting table; forming a pre-coated film at least on a surface of the gas injecting member by injecting processing gases from the gas injecting member into the chamber while heating the mounting table without having the object to be processed provided on the susceptor; and forming a Ti-based film on the object to be processed by mounting the object to be processed on the mounting table while the mounting table is heated and supplying the processing gases into the chamber, wherein in the pre-coated film forming process, a temperature of the mounting table is set to be lower than a temperature to form the Ti-based film.

Moreover, in the present invention, a gas flow rate is measured in the unit of mL/min. Since, however, volume of gas greatly varies depending on a temperature and a pressure, a value of the gas volume equivalent to standard state is used in the present invention. Further, a flow rate equivalent to the standard state is generally expressed as sccm (Standard cubic centimeter per minutes), so that the unit thereof is expressed as sccm. The standard state used herein indicate the state (STP) where a temperature is 0° C. (273.15K) and a pressure is 1 atm (101325 Pa).

In accordance with the present invention, a pre-coated film is formed while a temperature of a mounting table is set to be lower than a temperature for forming a Ti-based film, preferably lower than or equal to 500° C., so that sublimation of an AlF-based material formed on the mounting table can be suppressed during cleaning. Accordingly, it is possible to reduce adhesion of the AlF-based material to a surface of a gas injecting member, and also possible to suppress metal contamination or peeling-off of the pre-coated film of the gas injecting member during film formation.

Further, by performing the pre-coating at a temperature lower than a conventional temperature condition, even when the surface of the gas injecting member is made of Ni, the reaction between Ni and Ti contained in a processing gas can be suppressed. As a result, it is possible to suppress the generation of particles caused by formation of an NiTi layer or the change in color and quality of Ni.

DETAILED DESCRIPTION OF THE EMBODIMENT

Embodiments of the present invention will be described with reference to the accompanying drawings.

Figure 1:
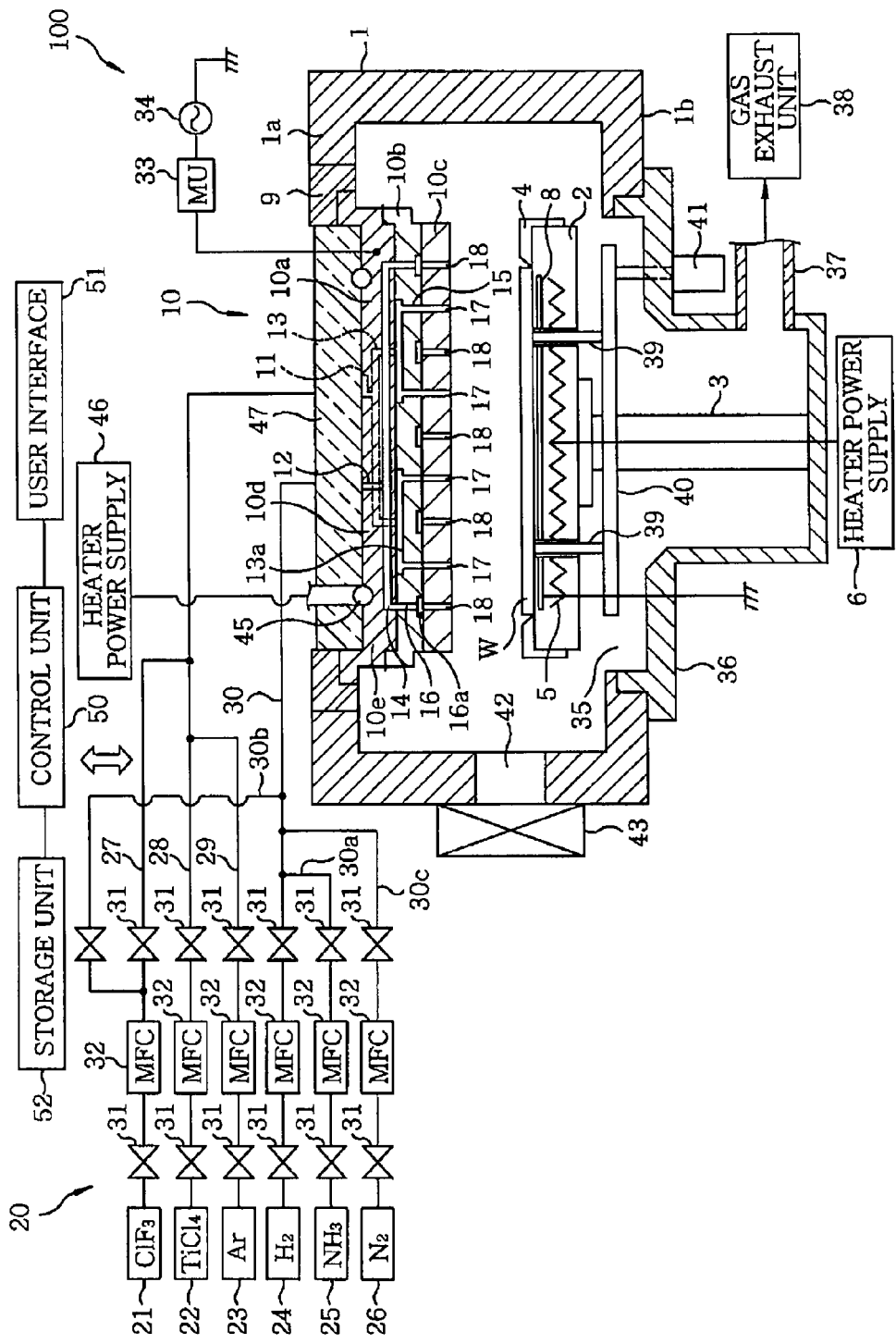
FIG. 1 is a schematic cross sectional view showing an example of a Ti film forming apparatus used for implementing a Ti film forming method in accordance with an embodiment of the present invention.

FIG. 1 is a schematic cross sectional view showing an example of a Ti film forming apparatus used for executing a Ti film forming method in accordance with an embodiment of the present invention. The Ti film forming apparatus 100 is configured as a plasma CVD film forming apparatus for performing CVD film formation by generating a plasma through forming a high frequency electric field between parallel plate electrodes.

The Ti film forming apparatus 100 includes a substantially cylindrical chamber 1. A susceptor 2 made of AlN is provided in the chamber 1 to horizontally support a wafer W serving as a substrate to be processed. The susceptor 2 is supported by a cylindrical supporting member 3 installed at a position in a central bottom portion thereof. A guide ring 4 for guiding the wafer W is installed at an outer edge portion of the susceptor 2. Further, a heater 5 is buried in the susceptor 2 to heat the wafer W up to a predetermined temperature by an electric power supplied from a heater power supply 6. An electrode 8 is buried in the susceptor 2 in the vicinity of the surface thereof, wherein the electrode 8 is grounded.

A shower head 10 serving as an upper electrode of the parallel plate electrodes is installed at a ceiling wall 1a of the chamber 1 via an insulating member 9. The shower head 10 has an upper block body 10a, an intermediate block body 10b and a lower block body 10c, and is formed in a substantially disk shape. The upper block body 10a has a horizontal portion 10d forming a showerhead main body together with the intermediate block body 10b and the lower block body 10c, and an annular supporting portion 10e extending upward from on an outer circumference of the horizontal portion 10d. The upper block body 10a is formed in a recess shape. Further, the entire shower head 10 is supported by the annular supporting portion 10e. Moreover, the lower block body 10c is provided with gas injection openings 17 and 18 through which gases are injected, the gas injection openings 17 and 18 being alternately arranged.

On a top surface of the upper block body 10a, a first gas inlet port 11 and a second gas inlet port 12 are provided. In the upper block body 10a, a number of gas passages 13 are branched from the first gas inlet port 11. Gas passages 15 are provided in the intermediate block body 10b, and the gas passages 13 communicate with the gas passages 15 via communication paths 13a extending horizontally. Furthermore, the gas passages 15 communicate with the gas injection openings 17 formed in the lower block body 10c. Besides, in the upper block body 10a, a number of gas passages 14 are branched from the second gas inlet port 12.

Gas passages 16 are formed in the intermediate block body 10b, and the gas passages 14 communicate with the gas passages 16. The gas passages 16 are connected to communication paths 16a extending horizontally through the intermediate block body 10b which communicate with the multiple gas injection openings 18 formed in the lower block body 10c. The first gas inlet port 11 and the second gas inlet port 12 are connected to gas lines of a gas supply mechanism 20.

The gas supply mechanism 20 has a $ClF_3$ gas supply source 21 for supplying $ClF_3$ gas serving as a cleaning gas, a $TiCl_4$ gas supply source 22 for supplying $TiCl_4$ gas which is a Ti compound gas, an Ar gas supply source 23 for supplying Ar gas, an $H_2$ gas supply source 24 for supplying $H_2$ gas serving as a reducing gas, an $NH_3$ gas supply source 25 for supplying an $NH_3$ gas serving as a nitriding gas, and an $N_2$ gas supply source 26 for supplying $N_2$ gas.

Further, $ClF_3$ gas supply lines 27 and 30b, a $TiCl_4$ gas supply line 28, an Ar gas supply line 29, an $H_2$ gas supply line 30, an $NH_3$ gas supply line 30a and an $N_2$ gas supply line 30c are connected to the $ClF_3$ gas supply source 21, the $TiCl_4$ gas supply source 22, the Ar gas supply source 23, the $H_2$ gas supply source 24, the $NH_3$ gas supply source 25 and the $N_2$ gas supply source 26, respectively. Moreover, each of the gas lines is provided with a mass flow controller 32 and two valves 31 disposed so that the mass flow controller 32 is located therebetween.

The first gas inlet port 11 is connected to the $TiCl_4$ gas supply line 28 extending from the $TiCl_4$ gas supply source 22, and the $TiCl_4$ gas supply line 28 is connected to the $ClF_3$ gas supply line 27 extending from the $ClF_3$ gas supply source 21 and the Ar gas supply line 29 extending from the Ar gas supply source 23. In addition, the second gas inlet port 12 is connected to the $H_2$ gas supply line 30 extending from the $H_2$ gas supply source 24, and the $H_2$ gas supply line 30 is connected to the $NH_3$ gas supply line 30a extending from the $NH_3$ gas supply source 25, the $N_2$ gas supply line 30C extending from the $N_2$ gas supply source 26 and the $ClF_3$ gas supply line 30b extending from the $ClF_3$ gas supply source 21.

Therefore, during the process, $TiCl_4$ gas from the $TiCl_4$ gas supply source 22 reaches inside the shower head 10 via the first gas inlet port 11 of the shower head 10 through the $TiCl_4$ gas supply line 28 together with Ar gas from the Ar gas supply source 23, and is injected into the chamber 1 through the gas injection openings 17 via the gas passages 13 and 15. On the other hand, $H_2$ gas from the $H_2$ gas supply source 24 reaches inside the shower head 10 via the second gas inlet port 12 of the shower head 10 through the $H_2$ gas supply line 30, and is injected into the chamber 1 through the gas injection openings 18 via the gas passages 14 and 16. That is, the shower head 10 is of a post-mix type in which $TiCl_4$ gas and $H_2$ gas are completely independently supplied into the chamber 1, and hence, these gases are mixed and react with each other after they are injected. However, it is not limited thereto, and may be of a pre-mix type in which $TiCl_4$ gas and $H_2$ gas are mixed and then supplied into the chamber 1.

The shower head 10 is connected to a high frequency power supply 34 via a matching unit (MU) 33, so that a high frequency power is supplied from the high frequency power supply 34 to the shower head 10. By supplying the high frequency power from the high frequency power supply 34, a plasma of the gas introduced into the chamber 1 through the shower head 10 is produced, and a film forming process is performed.

Further, a heater 45 is provided in the horizontal portion 10d of the upper block body 10a of the shower head 10 to heat the shower head 10. The heater 45 is connected to a heater power supply 46. By supplying electric power from the heater power supply 46 to the heater 45, the shower head 10 is heated to a desired temperature. A heat insulating member 47 is prepared in the recess of the upper block body 10a to increase heat transfer efficiency of the heater 45.

A circular hole 35 is formed in the center portion of a bottom wall 1b of the chamber 1, and a gas exhaust chamber 36 protruding downward to cover the hole 35 is provided at the bottom wall 1b. A gas exhaust line 37 is connected to a side surface of the gas exhaust chamber 36, and a gas exhaust unit 38 is connected to the gas exhaust line 37. Moreover, by operating the gas exhaust unit 38, the interior of the chamber 1 can be depressurized to a predetermined vacuum level.

Three wafer supporting pins 39 (only two shown) for supporting and moving up and down the wafer W are installed in the susceptor 2. The wafer supporting pins 39 can be protruded from and retracted into the surface of the susceptor 2 and are fixed to a support plate 40. Further, the wafer supporting pins 39 are moved up and down by a drive mechanism 41 such as an air cylinder through the support plate 40.

Installed at a sidewall of the chamber 1 are a loading/unloading port 42 for performing loading and unloading of the wafer between the chamber 1 and a transfer chamber (not shown) adjacent to the chamber 1 and a gate valve 43 for opening and closing the loading/unloading port 42.

The components of the Ti film forming apparatus 100 such as the heater power supplies 6 and 46, the valve 31, the mass flow controller 32, the matching unit 33, the high frequency power supply 34 and the like are connected to and controlled by a control unit 50 formed of a computer. Moreover, a user interface 51 is connected to the control unit 50, wherein the user interface 51 includes a keyboard for a process operator to input a command to manage the Ti film forming apparatus 100, a display for visualizing and displaying an operational status of the Ti film forming apparatus 100, and the like.

Furthermore, the control unit 50 is connected to a storage unit 52 which stores therein control programs used in realizing various processes, which are performed in the Ti film forming apparatus 100 under the control of the control unit 50, and programs or recipes to be used in operating each component of the Ti film forming apparatus 100 to carry out processes in accordance with processing conditions. The recipes are stored in a storage medium of the storage unit 52. The storage medium may be a built-in storage medium such as a hard disk or the like, or may be recorded on a portable storage medium such as a CD-ROM, a DVD or the like. Alternatively, the recipes can be transmitted from another apparatus, via, e.g., a dedicated line. Moreover, a necessary recipe is retrieved from the storage unit 52 in response to an instruction from the user interface 51 and is executed by the control unit 50, thereby performing a desired process in the Ti film forming apparatus 100 under control of the control unit 50.

Hereinafter, an embodiment of a Ti film forming method performed in the above-described film forming apparatus 100 will be explained.

Figure 2:
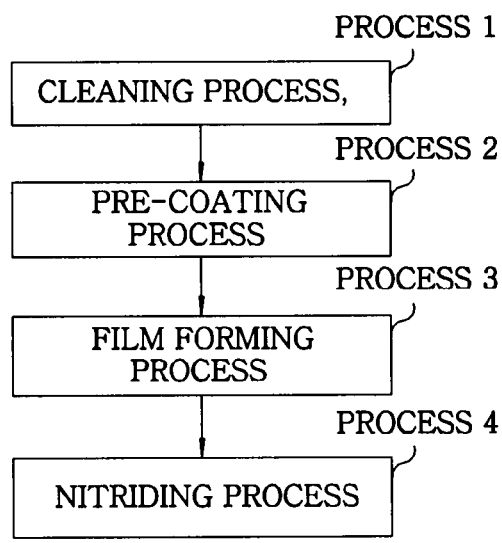
FIG. 2 provides a flow chart of the Ti film forming method in accordance with the embodiment of the present invention.

In the present embodiment, a cleaning process (process 1), a pre-coating process (process 2), a film forming process (process 3) and a nitriding process (process 4) are sequentially and repetitively performed on a plurality of wafers, as shown in FIG. 2. Further, the cleaning process and the pre-coating process may be performed at an interval of a predetermined number of wafers.

First of all, the cleaning process of process 1 will be explained.

In this process, after a Ti film is formed in a conventional manner, $ClF_3$ gas is introduced into the chamber while a wafer is not provided in the chamber 1 and, then, dry cleaning is carried out. The dry cleaning is carried out while heating the susceptor 2 by the heater 5 and a temperature at that time is preferably set to be within a range from 170° C. to 250° C. By performing the cleaning at a comparatively low temperature, reaction between $ClF_3$ gas and AlN forming the susceptor 2 is suppressed, and the amount of an AlF-based material $AlF_x$ formed on the susceptor 2 can be reduced. Moreover, in the cleaning process, it is also possible to use another fluorine-based gas such as $NF_3$, $F_2$ or the like other than $ClF_3$.

Next, the pre-coating process of process 2 will be described. Upon completion of the cleaning process, the chamber 1 is vacuumed by the gas exhaust unit 38, and a temperature of the susceptor 2 is increased by the heater 5 while introducing Ar gas and $N_2$ gas into the chamber 1. Thereafter, the pre-coating process is carried out.

In the pre-coating process, the temperature of the susceptor 2 is increased as described above while the wafer W is not provided in the chamber 1. When the temperature of the susceptor 2 is stabilized, Ar gas, $H_2$ gas and $TiCl_4$ gas are introduced at predetermined respective flow rates through the shower head 10. Next, a high frequency power is applied from the high frequency power supply 34 to the shower head 10, and Ar gas, $H_2$ gas and $TiCl_4$ gas introduced into the chamber 1 are converted into a plasma and react with each other. As a consequence, an extremely thin Ti film is formed on the inner wall of the chamber 1, the inner wall of the gas exhaust chamber 36, the shower head 10 and the susceptor 2.

Thereafter, while $H_2$ gas and Ar gas are continuously supplied, the supply of the $TiCl_4$ gas is stopped, and $NH_3$ gas serving as a nitriding gas is supplied. At the same time, a high frequency power is applied from the high frequency power supply 34 to the shower head 10. Accordingly, a plasma of the gases is produced, thereby nitriding the Ti film. A pre-coated film is formed by repeating the Ti film forming process and the nitriding process multiple times, e.g., 70 times.

The temperature of the susceptor 2 in the pre-coating process is lower than that in a film forming process to be described later.

The reason why the temperature of the susceptor in the pre-coating process is set to be lower than that in the film forming process will now be described in detail with reference to the schematic diagrams of FIGS. 3 to 6.

Figure 3:
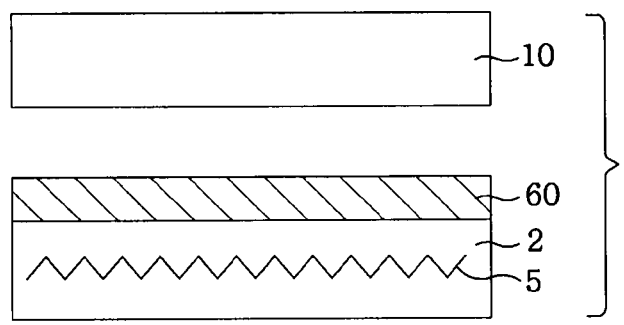
FIG. 3 schematically describes states of a susceptor and a shower head obtained after completion of a cleaning process.
Figure 4:
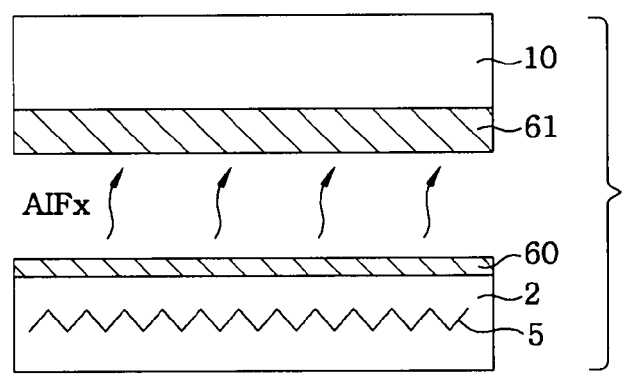
FIG. 4 schematically illustrates states of the susceptor and the shower head during a period spanning from a time of completion of the cleaning process to a time of beginning of a pre-coating process.
Figure 5:
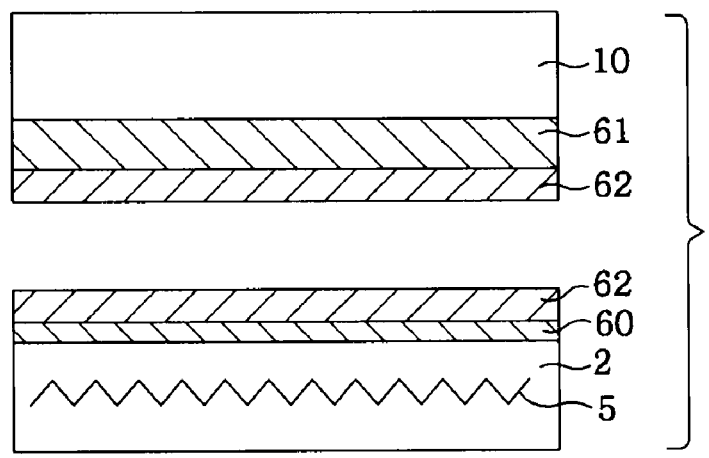
FIG. 5 schematically shows states of the susceptor and the shower head obtained during a pre-coating process performed under a conventional susceptor temperature condition.

In the cleaning process, $ClF_3$ gas is supplied and is made to react on the surface of the susceptor 2 with AlN which is a constituent material of the susceptor 2. Accordingly, an AlF-based material $AlF_x$ is produced and adhered to the susceptor 2, thereby forming an $AlF_x$ film 60 as shown in FIG. 3. Conventionally, the temperature of the susceptor 2 is increased to the same temperature used in the film forming process and a pre-coating process is performed thereafter. Therefore, while the temperature is increasing, $AlF_x$ is sublimated from the $AlF_x$ film 60 and adhered to the surface of the shower head 10, thus forming an $AlF_x$ film 61 as shown in FIG. 4. If the pre-coating process is carried out in the conventional manner, a pre-coated film 62 is formed on the top surface of the $AlF_x$ film 60 and the bottom surface of the $AlF_x$ film 61, as can be seen from FIG. 5. Since $AlF_x$ is easily peeled off due to the lower adhesivity, the pre-coated film 62 is peeled off from portions where the $AlF_x$ film 61 of the shower head 10 is formed during the film forming process, which causes generation of particles.

Figure 6:
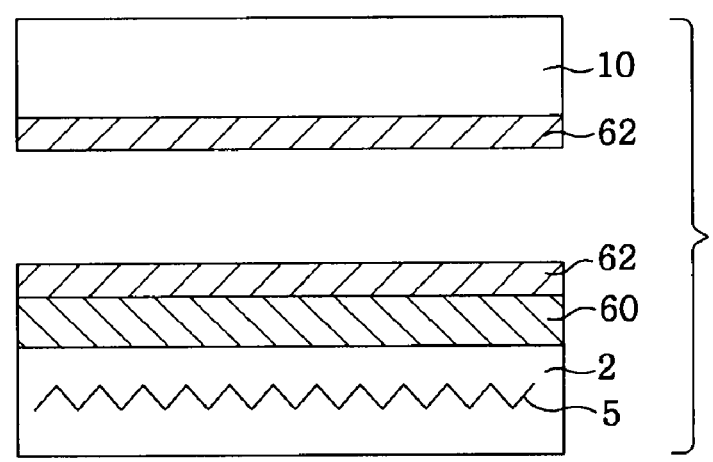
FIG. 6 schematically shows states of the susceptor and the shower head obtained during a pre-coating process performed under a susceptor temperature condition of the present invention.

On the other hand, in the present embodiment, the temperature of the susceptor 2 in the pre-coating process is set to be lower than that in the film forming process. Therefore, the sublimation of $AlF_x$ formed on the susceptor 2 is suppressed, and it is difficult for $AlF_x$ to be adhered to the surface of the shower head 10, as shown in FIG. 6. As a consequence, the peeling-off of the pre-coated film during the film forming process can be suppressed. In addition, the temperature of the susceptor in the pre-coating process is preferably set to be lower than or equal to 500° C. This is because the adhesion of $AlF_x$ to the shower head is further suppressed at a temperature lower than or equal to 500° C. More preferably, the temperature of the susceptor is set to be within a range from 350° C. to 500° C. When it is lower than 350° C., it is difficult to form a pre-coated film on the surface of the susceptor.

Further, the susceptor 2 is made of a ceramic unlike the shower head 10, and thus holds $AlF_x$ thereto more strongly in comparison with the shower head 10 made of a metal having a polished surface. Moreover, a pre-coated film is formed on the top surface of the susceptor 2, so that the pre-coated film is not peeled off and separated from the top surface of the susceptor 2.

Besides, the sublimation amount of $AlF_x$ formed on the susceptor 2 by cleaning depends on heating time as well as temperature. For that reason, a period of time spanning from when the cleaning is completed to when the temperature is increased to a level for pre-coating needs to be as short as possible, and preferably 60 minutes or less.

Meanwhile, the temperature of the shower head 10 is preferably set to be within in a range from 300° C. to 480° C. When it is lower than 300° C., the reactivity of $TiCl_4$ gas decreases, and it is difficult to form a pre-coated film. When it is higher than 480° C., the reactivity between Ni and Ti on the surface of the shower head 10 increases, and it is easy to form a NiTi layer on the surface of the shower head 10.

Preferable conditions of the pre-coating process are described as follows. More preferable conditions are described in brackets (hereinafter the same).

(1) Ti Film Formation
  i) high frequency power supplied from the high frequency power supply 34
    frequency: 300 kHz ~27 MHz
    power: 100~1500 (800) W
  ii) $TiCl_4$ gas flow rate: 1~18 (6.7) mL/min(sccm)

iii) Ar gas flow rate: 100~2000 (1600) mL/min(sccm)
iv) H$_2$ gas flow rate: 250~5000 (4000) mL/min(sccm)
v) pressure in chamber: 440~1200 (667) Pa (3~9 Torr)

(2) Nitriding Process i) high frequency power supplied from the high frequency power supply 34
frequency: 300 kHz~27 MHz
power: 500~1500 (800) W
ii) NH$_3$ gas flow rate: 100~2000 (500) mL/min(sccm)
iii) Ar gas flow rate: 100~2000 (1600) mL/min(sccm)
iv) H$_2$ gas flow rate: 250~5000 (4000) mL/min(sccm)
v) pressure in chamber: 440~1200 (667) Pa (3~9 Torr)

Although the nitriding process is not necessary, it is preferably performed in view of preventing oxidation of a Ti film (pre-coated film) or the like.

Upon completion of the pre-coating process, the film forming process of process 3 is carried out. In the film forming process, the temperature of the susceptor 2 is increased first to a film forming temperature by the heater 5. Next, the inside of the chamber 1 is adjusted to keep it under an environment close to the outer atmosphere connected thereto via the gate valve 43. Then, the wafer W is loaded from a wafer transfer chamber (not shown) which is in a vacuum state into the chamber 1 via the loading/unloading port 42. Thereafter, in the same sequence of forming the Ti film on the shower head 10 and the like in the pre-coating process, Ar gas, H$_2$ gas and TiCl$_4$ gas introduced into the chamber 1 are converted into a plasma and react with each other, thus forming a Ti film of a predetermined thickness on the wafer W.

Preferable conditions of the film forming process are described as follows.

i) high frequency power supplied from the high frequency power supply 34
frequency: 300 kHz~27 MHz
power: 100~1500 (800) W
ii) temperature of the susceptor 2 by the heater 5: 500~700° C.
iii) temperature of the shower head 10 by the heater 45: 300~500° C.
iv) TiCl$_4$ gas flow rate: 1~18 (12) mL/min (sccm)
v) Ar gas flow rate 100~2000 (1600) mL/min (sccm)
vi) H$_2$ gas flow rate: 250~5000 (4000) mL/min (sccm)
vii) pressure in chamber: 440~1200 (667) Pa (3~9 Torr)

Upon completion of the film forming process, the nitriding process of process 4 is carried out. The nitriding process is performed in the same sequence of nitriding the Ti film formed on the shower head 10 and the like in the pre-coating process such that a plasma of Ar gas, H$_2$ gas and NH$_3$ gas introduced into the chamber 1 is produced, and a Ti film formed on the wafer W is nitrided by the plasma of those gases.

Preferable conditions of the nitriding process are described as follows.

i) high frequency power supplied from the high frequency power supply 34
frequency: 300 kHz~27 MHz
power: 100~1500 (800) W
ii) temperature of the susceptor 2 by the heater 5: 500~700° C.
iii) temperature of the shower head 10 by the heater 45: 300~500° C.
iv) NH$_3$ gas flow rate: 100~2000 (1500) mL/min (sccm)
v) Ar gas flow rate: 100~2000 (1600) mL/min (sccm)
vi) H$_2$ gas flow rate: 250~5000 (2000) mL/min (sccm)
vii) pressure in chamber: 440~1200 (667) Pa (3~9 Torr)

Although this process is not necessary, it is preferably performed in view of preventing oxidation of a Ti film or the like.

Figure 7:
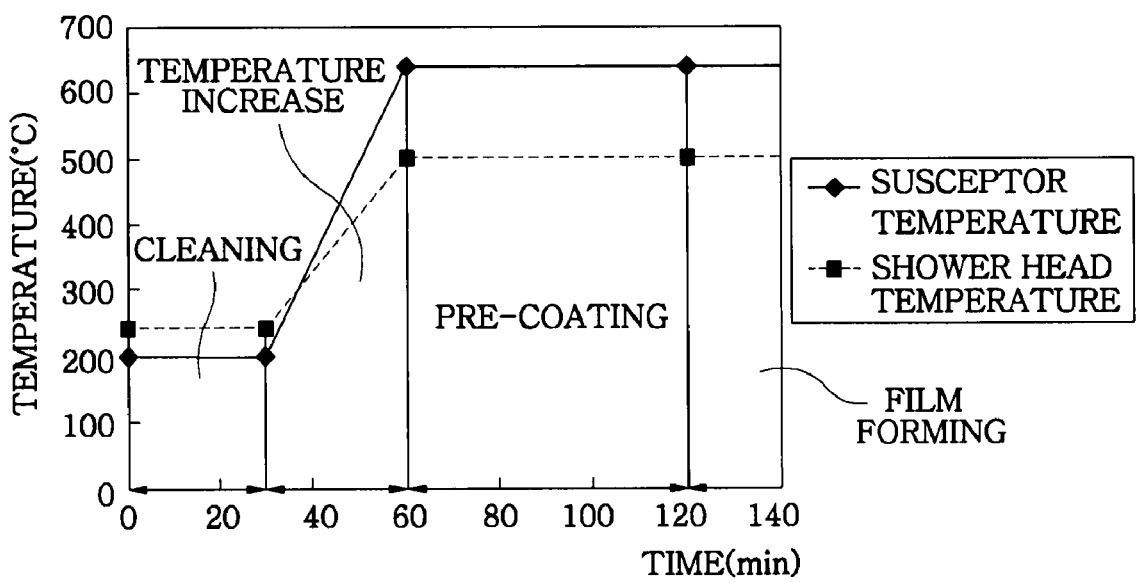
FIG. 7 shows an example of a conventional susceptor temperature profile.

Hereinafter, specific examples of temperature profiles of the susceptor and the shower head in the film forming process of the present invention will be explained compared to examples of conventional temperature profiles. FIG. 7 shows specific examples of conventional temperature profiles of the susceptor and the shower head, and FIG. 8 shows specific examples of temperature profiles of the susceptor and the shower head of the present invention.

Referring to the conventional profiles shown in FIG. 7, upon completion of the cleaning process, the temperatures of the susceptor 2 and the shower head 10 were increased up to 640° C. and 500° C., respectively, for 30 minutes. Next, the pre-coating was performed at such temperatures for 60 minutes. Thereafter, the film formation was performed on a predetermined number of wafers W while maintaining the temperatures of the susceptor 2 and the shower head 10.

Figure 8:
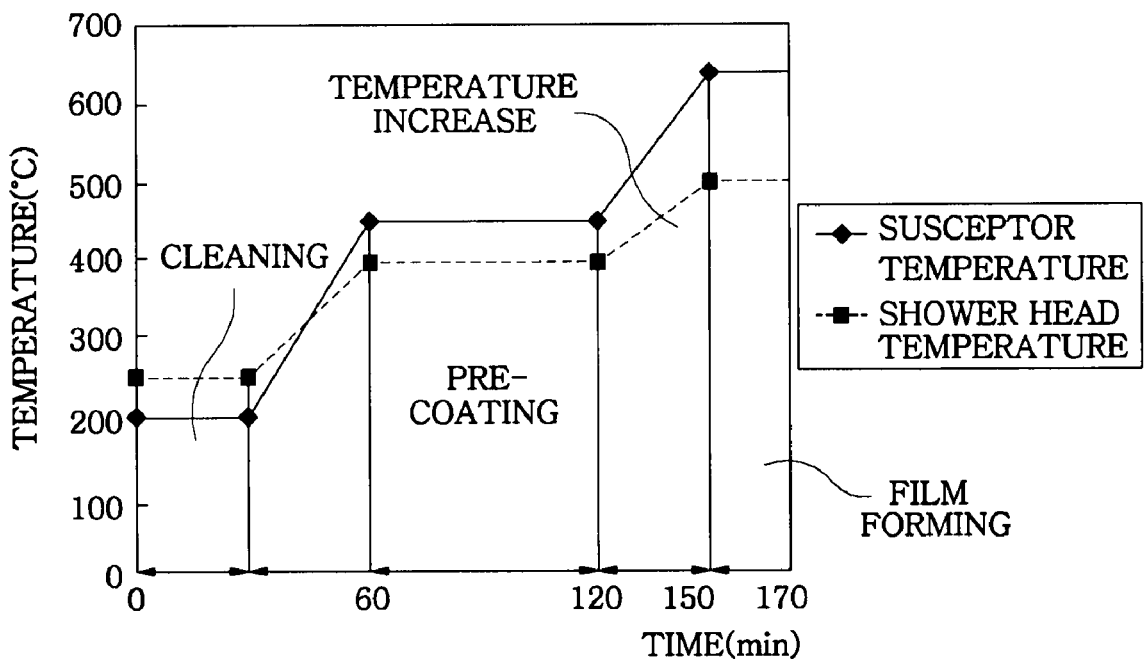
FIG. 8 shows an example of a susceptor temperature profile of the present invention.

On the other hand, referring to the profiles of the present invention illustrated in FIG. 8, upon completion of the cleaning process, the temperatures of the shower head 10 and the susceptor 2 were increased up to 400° C. and 450° C., respectively, for 30 minutes. Thereafter, the pre-coating process was performed for 60 minutes while maintaining the temperatures of the shower head 10 and the susceptor 2. Next, the temperatures of the susceptor 2 and the shower head 10 were increased up to 640° C. and 500° C., respectively, for 30 minutes and, then, the film formation was performed on a predetermined number of wafers W.

Hereinafter, the test which examined the effects of the present invention will be explained.

<Test 1>

Here, a Ti film was formed in accordance with the temperature profile of the conventional case and those of the present invention which are illustrated in FIGS. 7 and 8 and, then, metal atoms disposed on the wafer were counted. The result thereof is shown in Table 1.

TABLE 1

| | unit: $10^{10}$ atoms/cm$^2$ | | | |
|---|---|---|---|---|
| | Al | Cu | Fe | Ni |
| Conventional case | 37 | 2.6 | 2.9 | 13 |
| Present invention | 3.7 | 0.043 | 2.8 | 8.9 |

As can be seen from Table 1, when a film was formed in accordance with the present invention, the amount of Al forming AlF$_x$ was reduced by 1/10 compared with that measured in the conventional case, and the amounts of Cu and Ni were also reduced.

From the above, it has been found that the effect of suppressing generation of AlF$_x$ particles or metal contamination can be achieved by forming a Ti film in accordance with the present invention. Further, it has also been found that it is possible to suppress contamination of metal such as Cu, Ni or the like contained in the susceptor, the chamber or the shower head.

<Test 2>

Here, in order to examine the relationship between a temperature of the susceptor 2 and a sublimation amount of AlF$_x$, the amount of AlF$_x$ adhered to the wafer W when forming AlF$_x$ on the susceptor 2 was examined in the following manner.

Figure 9:
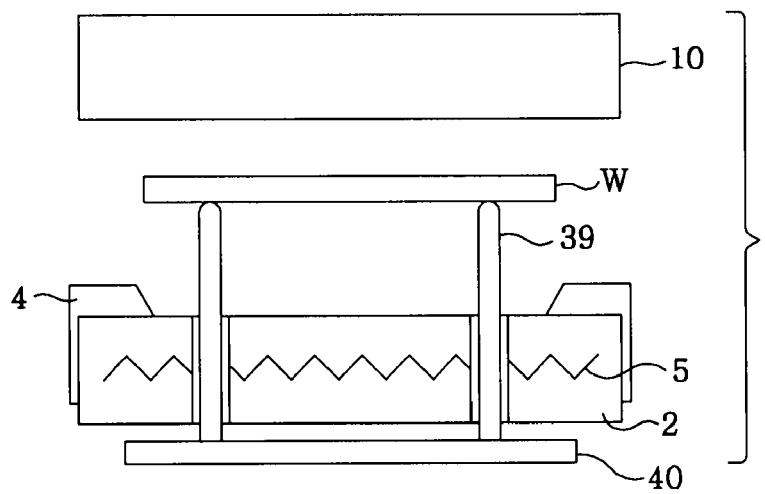
FIG. 9 explains a state of a wafer for the measurement of the number of particles of $AlF_x$ sublimated from the susceptor and adhered to the wafer.
Figure 10:
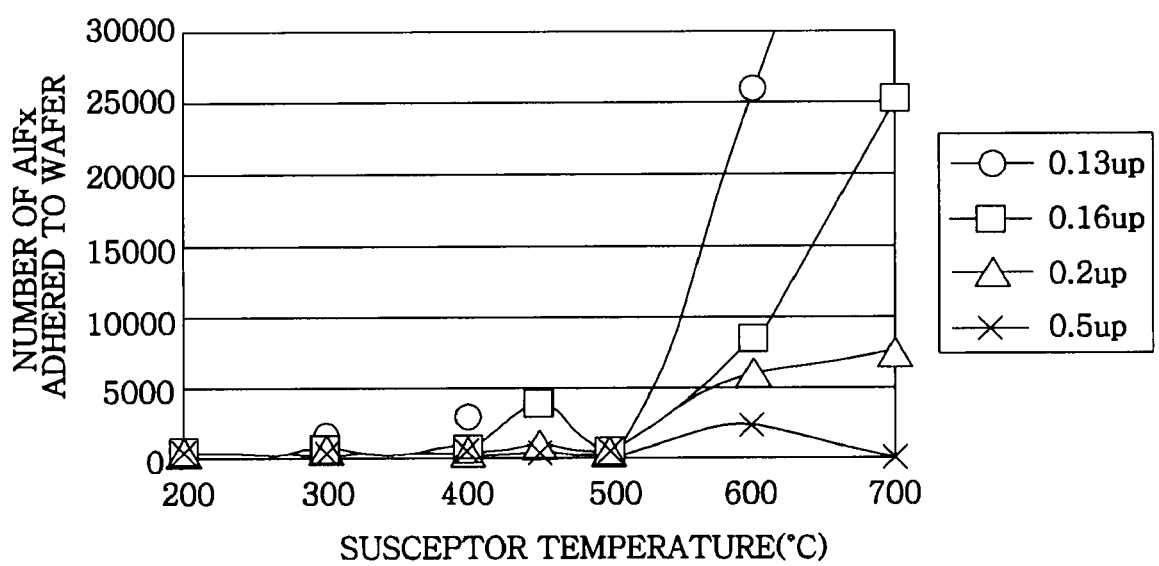
FIG. 10 shows a relationship between the susceptor temperature and the number of $AlF_x$ adhered to a wafer.

First of all, while a wafer W was not provided in the chamber 1, cleaning was performed for 40 minutes while setting a temperature of the susceptor 2 to 200° C. by the heater 5 to thereby form AlF$_x$ on the susceptor 2. Next, each of sampling wafers W was transferred through the loading/unloading port 42 while maintaining a film forming surface of the wafer W to face the susceptor 2 and then supported by the raised wafer supporting pins 39, as shown in FIG. 9. In that state, the temperature of the susceptor 2 was increased to keep the wafer W at an appropriate temperature by the heater 5 for 30 minutes, and AlF$_x$ sublimated from the susceptor 2 was allowed to be adhered to the wafer W. After the wafer W was unloaded from the chamber 1, the number of AlF$_x$ on the wafer W was measured by using a particle counter. FIG. 10 presents the relationship between a susceptor temperature and the number of AlF$_x$ adhered to a wafer W which was obtained from the measurement result.

As can be seen from FIG. 10, when the temperature of the susceptor 2 was lower than or equal to 500° C., the numbers of AlF$_x$ adhered to the wafers W were small. However, when the temperature was higher than 500° C., the numbers of AlF$_x$ adhered to the wafers W were greatly increased. From the above, it has been found that it is preferable to set the temperature of the susceptor 2 to be lower than or equal to 500° C.

Figure 11:
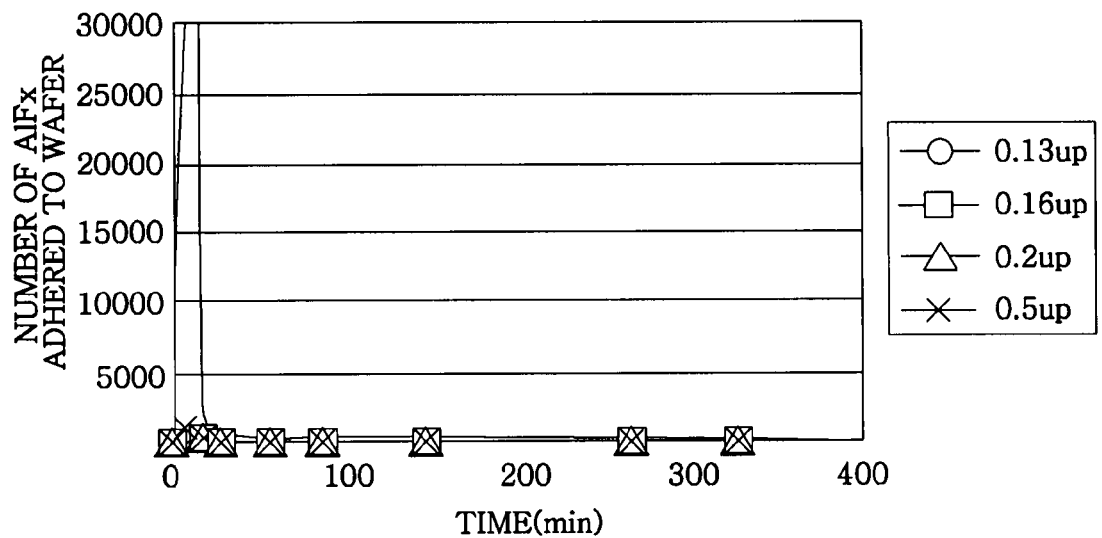
FIG. 11 is a graph presenting a relationship between susceptor heating time and the number of $AlF_x$ adhered to a wafer while maintaining a susceptor temperature at 650° C.
Figure 12:
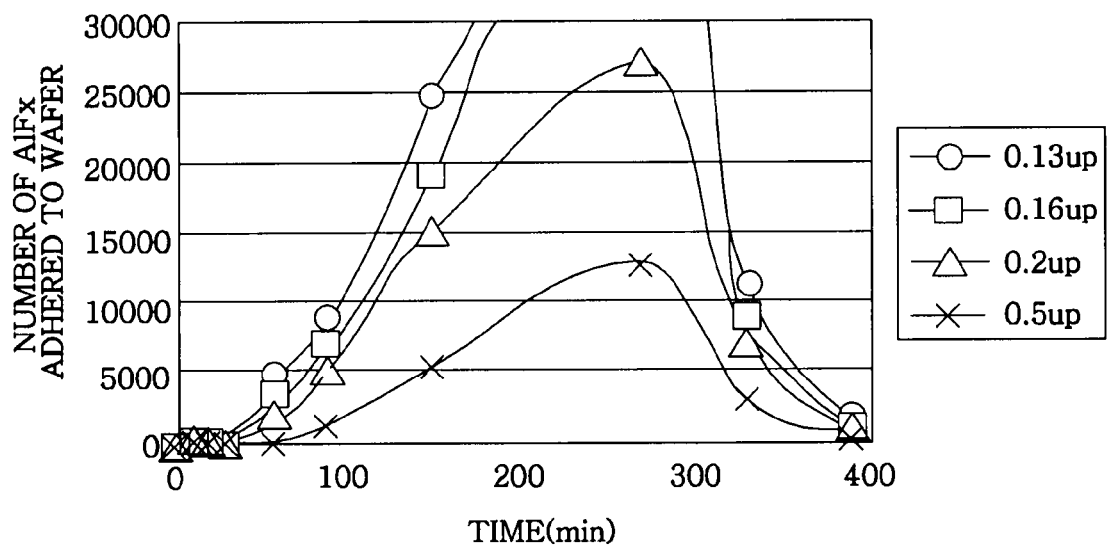
FIG. 12 is a graph presenting a relationship between susceptor heating time and the number of $AlF_x$ adhered to the wafer while maintaining a susceptor temperature at 450° C.

Next, the cleaning process was performed while setting the temperature of the susceptor 2 to 300° C. Thereafter, in the same manner described above, each of sampling wafers W was supported by the wafer supporting pins 39 as shown in FIG. 9 and, then, the susceptor temperature was increased to 650° C. as in the prior art and 450° C. in accordance with the present invention. Then, the number of AlF$_x$, which were sublimated from the susceptor 2 and adhered to each of the wafer W while varying time to heat the wafer W, was measured by a particle counter. FIGS. 11 and 12 illustrate the relationship between susceptor heating time and the number of AlF$_x$ adhered to a wafer which was obtained from the measurement result. FIG. 11 presents the measurement result under the conventional condition, and FIG. 12 represents the measurement result under the condition of the present invention.

In FIGS. 10 to 12, 0.13 up, 0.16 up, 0.2 up and 0.5 up represent the number of particles having particle diameters equal to or greater than 0.13 μm, 0.16 μm, 0.2 μm and 0.5 μm, respectively.

As shown in FIG. 11, when the susceptor temperature was 650° C. corresponding to the conventional condition, it was found that AlF$_x$ started to be adhered to the wafer W within 20 minutes right after the start of the heating of the susceptor 2. On the other hand, as illustrated in FIG. 12, when the susceptor temperature was 450° C. corresponding to the condition of the present invention, it was found that AlF$_x$ started to be adhered to the wafer W after 60 minutes had elapsed since the start of the heating.

From the above, it has been found that the sublimation of AlF$_x$ formed on the susceptor 2 was considerably suppressed when cleaning, pre-coating and film forming processes were carried out under the conditions of the present invention compared to when such processes were performed under the conventional conditions. As a result, the effect of the present invention which can suppress the peeling-off of the pre-coated film of the shower head during the film formation has been clearly demonstrated.

Further, the present invention is not limited to the above-described embodiment, and may be variously modified. For example, in the above embodiment, the present invention is applied to formation of a Ti film. However, the present invention is not limited thereto, and may be applied to formation of another Ti-based film such as a TiN film formed by using another gas containing TiCl$_4$ gas, or the like. Moreover, in the above embodiment, the susceptor is made of an AlN material. However, the susceptor may be made of a material that does not contain Al and may be formed with a coating layer containing Al on a surface thereof. Furthermore, in the above embodiment, the shower head is made of a material containing nickel such as pure Ni, Ni alloy or the like. However, a coating layer containing nickel may be formed thereon. In addition, a substrate to be processed is not limited to a semiconductor wafer, and may be another one, e.g., a substrate for use in liquid crystal display (LCD) or the like.

What is claimed is:

1. A Ti-based film forming method for forming a Ti-based film on a surface of an object to be processed by using an apparatus including a chamber accommodating the object to be processed, a gas injecting member for injecting a processing gas containing Ti into the chamber, the gas injecting member having a first heating unit, a mounting table for mounting thereon the object to be processed in the chamber, wherein the mounting table has at least a surface made of a material containing Al, and a second heating unit for heating the mounting table, the Ti-based film forming method comprising:

cleaning an inside of the chamber by introducing a cleaning gas containing fluorine into the chamber while the object to be processed is not provided on the mounting table;

forming a pre-coated film at least on a surface of the gas injecting member by injecting processing gases from the gas injecting member into the chamber while maintaining the mounting table at a first temperature via the second heating unit without having the object to be processed provided on the mounting table and maintaining the gas injecting member at a second temperature via the first heating unit, the second temperature being different from the first temperature;

after forming the pre-coated film, increasing a temperature of the mounting table to a third temperature via the second heating unit and increasing a temperature of the gas injecting member to a fourth temperature via the first heating unit, the fourth temperature being different from the third temperature; and forming a Ti-based film on the object to be processed by mounting the object to be processed on the mounting table while the mounting table is heated at the third temperature and the gas injecting member is heated at the fourth temperature, and supplying the processing gases into the chamber.

2. The Ti-based film forming method of claim 1, wherein the mounting table is made of AlN.

3. The Ti-based film forming method of claim 1, wherein the gas injecting member has at least a surface made of a material containing Ni.

4. The Ti-based film forming method of claim 1, wherein when the pre-coated film is formed, the first temperature of the mounting table is set to be lower than or equal to 500° C.

5. The Ti-based film forming method of claim 4, wherein when the Ti-based film is formed, the third temperature of the mounting table is set to be within a range from 500° C. to 700° C.

6. The Ti-based film forming method of claim 1, wherein when the pre-coated film is formed, the second temperature of the gas injecting member is set to be within a range from 300° C. to 480° C.

7. The Ti-based film forming method of claim 6, wherein when the pre-coated film is formed, the second temperature of the gas injecting member is set to be greater than or equal to 300° C. and less than 450° C.

8. The Ti-based film forming method of claim 1, wherein a temperature of the mounting table is set to be within a range from 170° C. to 250° C. in the cleaning process.

9. The Ti-based film forming method of claim 1, wherein a Ti-based film is formed by a source gas containing Ti and a reducing gas in the pre-coated film forming process and the Ti-based film forming process.

10. The Ti-based film forming method of claim 1, wherein when the pre-coated film is formed, a source gas containing Ti and a reducing gas are alternately supplied.

11. The Ti-based film forming method of claim 1, wherein the pre-coating process includes a nitriding process of the pre-coated film.

12. The Ti-based film forming method of claim 1, wherein the Ti-based film is a Ti film.

13. The Ti-based film forming method of claim 12, wherein the processing gas contains $TiCl_4$ gas and $H_2$ gas.

14. The Ti-based film forming method of claim 12, wherein after the Ti-based film forming process is completed, a nitriding process is performed on the Ti film.

15. The Ti-based film forming method of claim 1, wherein a period of time spanning from when the cleaning is completed to when the temperature of the mounting table is increased to the first temperature for the pre-coated film formation is set to be shorter than or equal to 60 minutes.

16. The Ti-based film forming method of claim 15, wherein when the pre-coated film is formed, the second temperature of the gas injecting member is set to be within a range from 300° C. to 480° C.

17. The Ti-based film forming method of claim 15, wherein when the pre-coated film is formed, the second temperature of the gas injecting member is set to be greater than or equal to 300° C. and less than 450° C.

18. The Ti-based film forming method of claim 17, wherein when the Ti-based film is formed, the third temperature of the mounting table is set to be within a range from 500° C. to 700° C.

19. The Ti-based film forming method of claim 1, wherein the cleaning gas is $ClF_3$ gas.

20. The Ti-based film forming method of claim 1, wherein the gas injecting member is a shower head which is disposed to face the mounting table and has a plurality of gas injecting openings.

* * * * *